(12) United States Patent
Sewell et al.

(10) Patent No.: US 6,757,110 B2
(45) Date of Patent: Jun. 29, 2004

(54) CATADIOPTRIC LITHOGRAPHY SYSTEM AND METHOD WITH RETICLE STAGE ORTHOGONAL TO WAFER STAGE

(75) Inventors: Harry Sewell, Wilton, CT (US); Jorge Ivaldi, Wilton, CT (US); John Shamaly, Wilton, CT (US)

(73) Assignee: ASML Holding N.V. (NL)

( * ) Notice: Subject to any disclaimer, the term of this patent is extended or adjusted under 35 U.S.C. 154(b) by 0 days.

(21) Appl. No.: 10/156,005

(22) Filed: May 29, 2002

(65) Prior Publication Data

US 2003/0223125 A1 Dec. 4, 2003

(51) Int. Cl.$^7$ ................................................ G02B 9/00
(52) U.S. Cl. ...................................................... 359/754
(58) Field of Search ........................ 359/754, 649–651, 359/726–736

(56) References Cited

U.S. PATENT DOCUMENTS

| | | |
|---|---|---|
| 4,760,429 A | 7/1988 | O'Connor |
| 4,952,858 A | 8/1990 | Galburt |
| 4,973,217 A | 11/1990 | Engelbrecht |
| 5,085,558 A | 2/1992 | Engelbrecht |
| 5,131,013 A | 7/1992 | Choi |
| 5,193,972 A | 3/1993 | Engelbrecht |
| 5,285,142 A | 2/1994 | Galburt et al. |
| 5,537,260 A | 7/1996 | Williamson ................. 359/727 |
| 5,677,758 A | 10/1997 | McEachern et al. |
| 5,691,802 A | 11/1997 | Takahashi ..................... 355/83 |

(List continued on next page.)

FOREIGN PATENT DOCUMENTS

| | | |
|---|---|---|
| EP | 0 951 054 A1 | 10/1999 |
| WO | WO98/40791 A1 | 9/1998 |
| WO | WO 01/40875 A1 | 6/2001 |

OTHER PUBLICATIONS

*Micrascan II: The ultimate lithography solution for 0.5μm to 0.25μm,* SVG Lithography Systems, Inc., 26 pages (Jun. 25, 1992).

Japanese Patent Abstract, No. 05–175098, Jul. 13, 1993 (date of publication), 1 page.

(List continued on next page.)

Primary Examiner—Scott J. Sugarman
Assistant Examiner—Darryl J. Collins
(74) Attorney, Agent, or Firm—Sterne, Kessler, Goldstein & Fox P.L.L.C.

(57) ABSTRACT

The present invention relates to a lithography apparatus using catadioptric exposure optics that projects high quality images without image flip. The lithography apparatus includes a reticle stage, a wafer stage, and a catadioptric exposure optics located between the reticle stage and the wafer stage. The catadioptric exposure optics projects an image from the reticle stage onto the wafer stage. The projected image has the same image orientation as the image from the reticle stage. In other words, the catadioptric exposure optics does not perform image flip. The reticle stage lies on a first plane and the wafer stage lies on a second plane, where the first plane is orthogonal to the second plane. In another embodiment of the present invention, the catadioptric exposure optics projects an even number of reflections. The projected image is of high precision and lacks aberrations such as perspective warping and obscured areas. The invention can be combined with a dual wafer stage and with a dual isolation system.

14 Claims, 10 Drawing Sheets

U.S. PATENT DOCUMENTS

| | | |
|---|---|---|
| 5,733,096 A | 3/1998 | Van Doren et al. |
| 5,757,160 A | 5/1998 | Kreuzer |
| 5,812,271 A | 9/1998 | Kim |
| 5,835,195 A | 11/1998 | Gibson et al. |
| 5,861,997 A * | 1/1999 | Takahashi .................. 359/727 |
| 6,020,964 A | 2/2000 | Loopstra et al. |
| 6,036,162 A | 3/2000 | Hayashi |
| 6,097,537 A | 8/2000 | Takahashi et al. .......... 359/364 |
| 6,208,407 B1 | 3/2001 | Loopstra |
| 6,307,619 B1 | 10/2001 | Galburt et al. |
| 6,327,024 B1 | 12/2001 | Hayashi et al. |
| 6,329,780 B1 | 12/2001 | Ebihara et al. |
| 6,538,720 B2 | 3/2003 | Galburt et al. |
| 2002/0118346 A1 | 8/2002 | Galburt et al. |
| 2003/0174304 A1 | 9/2003 | Galburt |

OTHER PUBLICATIONS

International Search Report for Appln. No. PCT/US00/42336, mailed May 2, 2001, 8 pages.

"Remote Location Optical Registration System", *IBM Technical Disclosure Bulletin*, vol. 30, No. 12, May 1988, pp. 209–210.

Copy of Search Report for Singapore Patent Application No. 200303068–1, dated Oct. 30, 2003, 5 pages.

* cited by examiner

| DESCRIPTION | IMAGE |
|---|---|
| ORIGINAL IMAGE: SEEN THROUGH THE GLASS RETICLE PLATE, CHROME SIDE DOWN | F |
| IMAGE AFTER 2ND REFLECTION: SEEN ON THE WAFER |  |

US 6,757,110 B2

CATADIOPTRIC LITHOGRAPHY SYSTEM AND METHOD WITH RETICLE STAGE ORTHOGONAL TO WAFER STAGE

CROSS-REFERENCE TO RELATED APPLICATIONS

This patent application is related to the following commonly-owned U.S. Patent Applications: U.S. patent application Ser. No. 09/449,630, now abandoned to Roux et al, entitled "Dual Stage Lithography Apparatus and Method," filed Nov. 30, 1999 and U.S. Pat. No. 6,538,720, to Galburt et al, for "Lithographic Tool with Dual Isolation System and Method for Configuring the Same," issued Mar. 25, 2003. The foregoing U.S. Patent Applications are hereby incorporated by reference in their entirety.

BACKGROUND OF THE INVENTION

1. Field of the Invention

This invention relates to an improved lithography system and method. More specifically, this invention relates to a lithography system and method using catadioptric exposure optics that projects high precision images without image flip.

2. Background Art

Lithography is a process used to create features on the surface of substrates. Such substrates can include those used in the manufacture of flat panel displays, circuit boards, various integrated circuits, and the like. A frequently used substrate for such applications is a semiconductor wafer. While this description is written in terms of a semiconductor wafer for illustrative purposes, one skilled in the art would recognize that this description also applies to other types of substrates known to those skilled in the art. During lithography, a wafer, which is disposed on a wafer stage, is exposed to an image projected onto the surface of the wafer by exposure optics located within a lithography apparatus. The image refers to the original, or source, image being exposed. The projected image refers to the image which actually contacts the surface of the wafer. While exposure optics are used in the case of photolithography, a different type of exposure apparatus may be used depending on the particular application. For example, x-ray or photon lithographies each may require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove exposed portions of underlying structural layers within the wafer, such as conductive, semiconductive, or insulative layers. This process is then repeated, together with other steps, until the desired features have been formed on the surface of the wafer.

Exposure optics comprise refractive and/or reflective elements, i.e., lenses and/or mirrors. Currently, most exposure optics used for commercial manufacturing consist only of lenses. However, the use of catadioptric (i.e., a combination of refractive and reflective elements) exposure optics is increasing. The use of refractive and reflective elements allows for a greater number of lithographic variables to be controlled during manufacturing. The use of mirrors, however, can lead to image flip problems.

Image flip occurs when an image is reflected off of a mirror. FIG. 1 shows an example of image flip. In this example, if one were to hold up plain English text to a mirror, one would notice that the text, viewed in the mirror, would appear to be written backwards. Thus, an image of the letter "F," would be seen as "ꟻ" in the mirror. This shows that when an image is reflected off of a mirror, the projected image results in an incorrect image orientation, i.e., the image transfer produces image flip. Of course, if the image is reflected off of two mirrors, the image orientation of the projected image would be correct because the image is flipped twice. Thus, an image of the letter "F," would be seen as "F" after the second reflection. Therefore, it can be seen that image flip results when an image is reflected an odd number of times. Conversely, it can be seen that image flip does not result when the image is reflected an even number of times.

Current lithographic systems typically include a reticle stage that is parallel to a wafer stage, such that the image from the reticle stage is projected downward onto the wafer stage. In addition, current lithographic systems typically include catadioptric exposure optics that require a magnifying mirror, such as a concave asphere. This mirror enhances the projected image and enables better exposure of the wafer. The parallel wafer and reticle stages together with the geometry of a magnifying mirror, however, makes it difficult for the catadioptric exposure optics to perform an even number of reflections.

To illustrate this point, FIG. 2 shows a simplified example lithographic system 200. System 200 shows a parallel reticle stage 202 and wafer stage 204 using catadioptric exposure optics 212, having a first mirror 206, a beam splitter 208, a quarter wave plate 209, and a magnifying mirror element group 210. In this example system 200, an image is projected from reticle stage 202 using P polarized light. This polarized light is reflected by first mirror 206 directly into magnifying mirror element group 210. It should be noted that quarter wave plate 209 can rotate the polarization angle of the light. The reflected image from first mirror 206 passes through beam splitter 208. This is due to the P polarization of the light being transmitted by beam splitter 208. The reflected image from magnifying mirror element group 210 has its polarization angle rotated 90°. This light is reflected at the beam splitter surface onto wafer 204. Thus, S polarization is not transmitted by beam splitter 208. Subsequently, the image is reflected directly out of magnifying mirror element group 210 that contains quarter wave plate 209. Besides flipping the image, magnifying mirror element group 210 also reverses the polarization of the image. Thus, the image reflected out of magnifying mirror element group 210 is then reflected by beam splitter 208, since the image now has the opposite polarization as beam splitter 208. The image is then projected onto parallel wafer stage 204. Using this configuration, an odd number of reflections occur. As a result, image flip problems occur.

Several alternative lithographic system designs, however, have attempted to overcome the image flip obstacle. One such design is a centrally obscured optical system design. FIG. 3 shows an example lithographic system 300 with a centrally obscured optical system design. System 300 shows a parallel reticle stage 302 and wafer stage 304 using catadioptric exposure optics 312 with a first mirror 306 and a magnifying mirror 308. In this example system 300, an image is projected from reticle stage 302 directly into magnifying mirror 308. It should be noted that the image projected from reticle stage 302 passes through first mirror 306. This is because first mirror 306 is polarized (in the same way as beam splitter 208 above). The image is then reflected directly out of magnifying mirror 308 and onto first mirror 306. Besides flipping the image, magnifying mirror 308 also reverses the polarization of the image. The image is then reflected downwards by first mirror 306, through a small hole 310 in magnifying mirror 308 and onto wafer stage 304. In this configuration, magnifying mirror 308 is in the path of the projected reflection of first mirror 306, which is why small hole 310 exists within magnifying mirror 308. The projected reflection of first mirror 306 travels through small hole 310 in magnifying mirror 308 to reach wafer stage 304. Using this configuration, an even number of reflections occur. Thus, there is no image flip problem. However, this configuration has its drawbacks. As the image is reflected by magnifying mirror 308, some of the image information (namely the portion of the image that passes through small hole 310 in magnifying mirror 308) is lost. This can produce aberrations or inconsistencies in the projected image.

Another lithographic system that has attempted to overcome the image flip obstacle is an off-axis design. FIG. 4 shows an example lithographic system 400 with an off-axis design. System 400 shows a parallel reticle stage 402 and wafer stage 404 using catadioptric exposure optics 412 with a first mirror 406 and a magnifying mirror 408. In this example system 400, an image is projected from reticle stage 402 onto a first mirror 406, reflected from first mirror 406 and into magnifying mirror 408, reflected out of magnifying mirror 408 and onto wafer stage 404. In this configuration, reticle stage 402 is off-axis from wafer stage 404. This is because the image is reflected away from the reticle stage in order to magnify it using magnifying mirror 408. As shown, there is a small angle 410 between first mirror 406 and wafer stage 404. Using this configuration, an even number of reflections occur. However, this configuration has its drawbacks. Magnifying mirror 408 does not directly (i.e., perpendicularly) receive the reflected image from first mirror 406. This is because magnifying mirror 408 must be able to receive a reflected image from first mirror 406 and reflect that image through a small angle 410 onto wafer stage 404. Further, magnifying mirror 408 does not directly reflect the image onto wafer stage 404. As a result, aberrations and perspective warping of the image can occur.

Therefore, it is difficult to create a lithographic system with catadioptric exposure optics that can produce a high quality image without image flip. Consequently, most lithographic systems today use a design similar to the design of FIG. 1. This design performs an odd-number of reflections that result in image flip problems. As a result, when exposing an image using these catadioptric exposure optics, it must be kept in mind that the projected image is the reverse of the desired image. This can lead to increased processing time and preparation. This problem is further compounded by the fact that most lithographic systems used today do not result in image flip. As a result, manufacturers that use both catadioptric exposure optics and non-catadioptric exposure optics (i.e., systems that have the image flip problem and systems that do not have the image flip problem) must use two reticle plates-one with each image orientation. This can lead to higher production costs.

In view of the above, what is needed is a lithographic system and method, using catadioptric exposure optics, which produces a high precision image without image flip.

BRIEF SUMMARY OF THE INVENTION

The present invention relates to a lithography system and method using catadioptric exposure optics that projects high quality images without image flip.

In an embodiment of the present invention, the lithography system and method includes a reticle stage, a wafer stage, and a catadioptric exposure optics located between the reticle stage and the wafer stage. The catadioptric exposure optics projects an image from the reticle stage onto the wafer stage. The projected image has the same image orientation as the image from the reticle stage. In other words, the catadioptric exposure optics does not perform image flip.

In an embodiment of the present invention, the reticle stage lies on a first plane and the wafer stage lies on a second plane, where the first plane is orthogonal to the second plane. In another embodiment of the present invention, the catadioptric exposure optics performs an even number of reflections. According to the present invention, the projected image is of high precision. Moreover, the projected image lacks aberrations such as perspective warping and obscured areas.

In another embodiment of the present invention, two wafer stages are used. Each wafer stage has associated load/unload and data collection stations. The load/unload and data collection stations are located on either side of an exposure station. The wafer stages are mounted on a common rail such that as a first stage moves away from the exposure station, a second stage can immediately move in to take its place under the exposure apparatus. Through this arrangement, use of the exposure apparatus is maximized. Because wafer data collection and exposure steps occur in parallel in the instant invention, the compromised wafer alignment strategies, sometimes employed to increase throughput, need not be used. In fact, the parallel nature of the instant invention allows for greater data collection without a corresponding decrease in throughput.

In another embodiment of the present invention, a dual isolation system is used. In one aspect, an isolated base frame is supported by a non-isolated tool structure. The wafer stage components are supported by the isolated base frame. The wafer stage components provide a mount for attachment of a semiconductor wafer. The reticle stage component is supported by the isolated base frame. The reticle stage component provides a mount for a reticle. An isolated bridge provides a mount for exposure optics. The isolated bridge is supported by the isolated base frame. Radiation from an illumination source passes through a reticle mounted at the provided reticle mount to a surface of an attached semiconductor wafer. A pattern of a mounted reticle is transferred to a surface of an attached semiconductor wafer.

An advantage of the present invention is the use of catadioptric exposure optics that does not perform image flip. This allows a manufacturer to use the same image with catadioptric and non-catadioptric lithographic systems. This increases compatibility and reduces production costs.

Another advantage of the present invention is projection of a high precision image onto the wafer stage. Unlike the prior art which uses alternative catadioptric exposure optics designs, the present invention projects a high quality image without aberrations such as perspective warping and obscuration areas in the optics pupil. This produces a higher quality product.

Another advantage of the present invention is maximization of the use of the exposure optics. This is due to wafer data collection and exposure steps occurring in parallel. The parallel nature of the present invention allows for greater data collection without a corresponding decrease in throughput. This increases the efficiency of the manufacturing process.

Another advantage of the present invention is the reduction of relative motion between critical elements of the lithography apparatus. The present invention uses multiple isolated systems to reduce motion loads, and relative motion between critical components, including components such as those included in a wafer stage, a reticle stage, and exposure optics. By reducing motion loads, and relative motion between one or more lithography system components, semiconductor wafers may be more precisely and repeatedly etched according to tighter tolerances.

Further features and advantages of the invention as well as the structure and operation of various embodiments of the present invention are described in detail below with reference to the accompanying drawings.

BRIEF DESCRIPTION OF THE FIGURES

The features and advantages of the present invention will become more apparent from the detailed description set forth below when taken in conjunction with the drawings in which like reference numbers indicate identical or functionally similar elements. Additionally, the left-most digit of a reference number identifies the drawing in which the reference number first appears.

DETAILED DESCRIPTION OF THE INVENTION

Table of Contents
I. Overview
  A. Definitions
  B. General Considerations
II. System Orientation
III. Exposure Optics
  A. Image Path
  B. Projected Image
IV. Dual Wafer Stage
V. Dual Isolation System
VI. Conclusion

DETAILED DESCRIPTION OF THE INVENTION

I. Overview

The present invention relates to a lithography system and method using catadioptric exposure optics that projects high quality images without image flip. The present invention allows for a more efficient and timely production of semiconductors.

A. Definitions

The following definitions are provided for illustrative purposes only. Alternative definitions for the listed terms will be apparent to persons skilled in the relevant art(s) based on the discussion contained herein, and fall within the scope and spirit of embodiments of the invention.

The term "catadioptric" refers to the use of reflective and refractive elements (i.e., mirrors and lenses).

B. General Considerations

The present invention is described in terms of the examples contained herein. This is for convenience only and is not intended to limit the application of the present invention. In fact, after reading the following description, it will be apparent to one skilled in the relevant art(s) how to implement the following invention in alternative embodiments.

II. System Orientation

Figure 5:
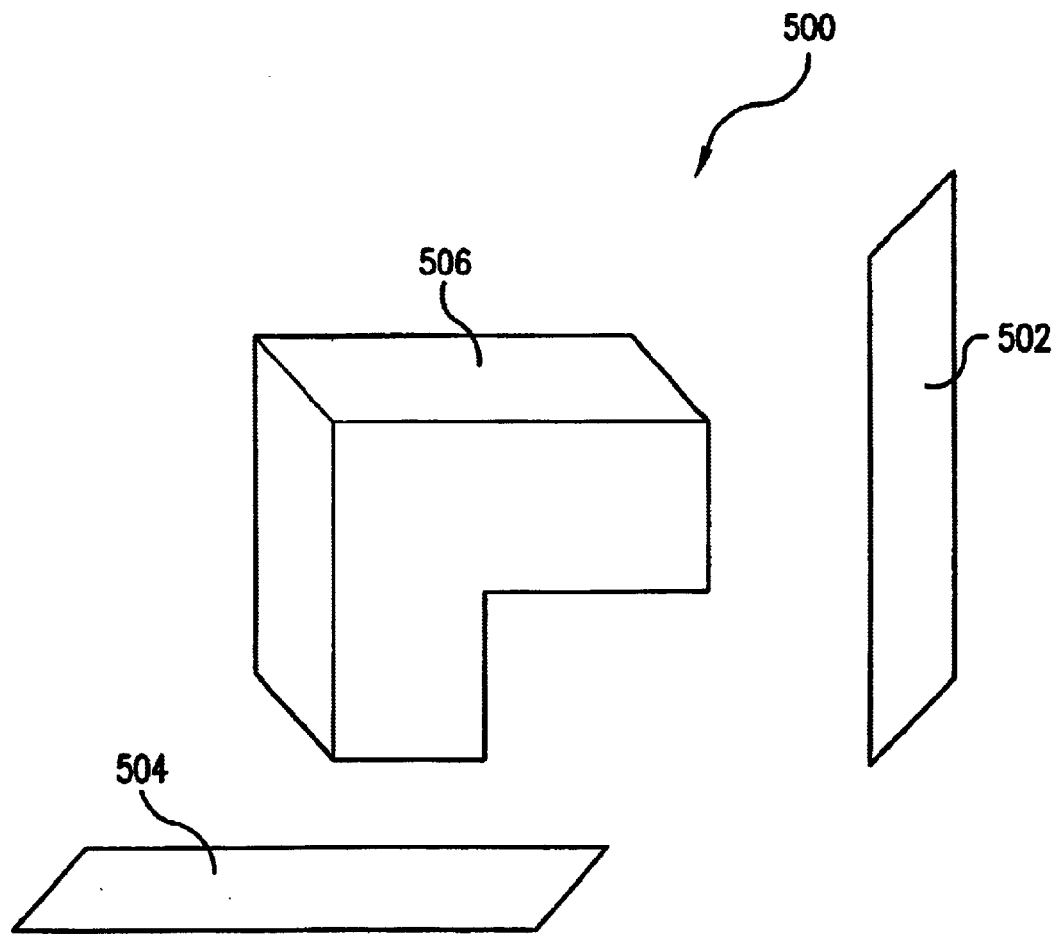
FIG. 5 is a diagram illustrating a lithographic system using orthogonal reticle and wafer stages, in an embodiment of the present invention.

FIG. 5 is a diagram illustrating a lithographic system 500, in an embodiment of the present invention. The figure shows a reticle stage 502, a wafer stage 504 and catadioptric exposure optics 506. During operation of system 500, an image (not shown) is associated with reticle stage 502. Subsequently, the image is projected into catadioptric exposure optics 506, which processes the image and projects the image onto wafer stage 504. Alternatively, the image can be reflected into catadioptric exposure optics 506. Heretofore, any reference to the projection of the image from reticle stage 502 into catadioptric exposure optics 506 will be interchangeable with the reflection of the image into the same.

In an embodiment of the present invention, reticle stage 502 is orthogonal to wafer stage 504. To illustrate this configuration, using FIG. 5 as an example, reticle stage 502 is situated on a first plane while wafer stage 504 is situated on a second plane, wherein the first plane is orthogonal to the second plane. This feature allows for the image orientation of the image projected onto wafer stage 504 to be congruent to the image orientation of the original image (i.e., the image is not flipped). Image orientation is explained in greater detail below.

III. Exposure Optics

Figure 6:
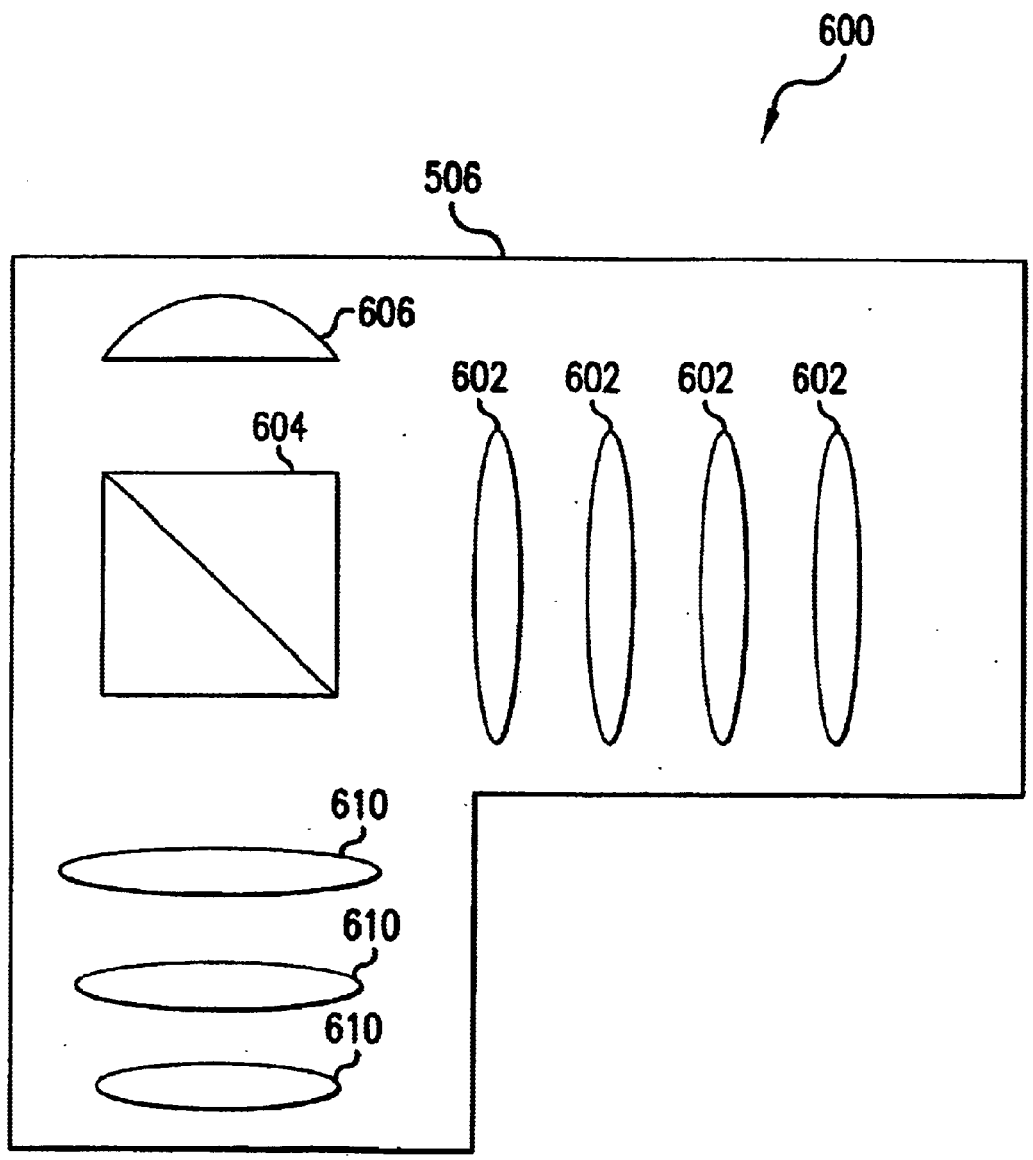
FIG. 6 is a diagram illustrating the catadioptric exposure optics of a lithographic system using orthogonal reticle and wafer stages, in an embodiment of the present invention.

FIG. 6 is a diagram illustrating a more detailed view of a catadioptric exposure optics 600, in an embodiment of the present invention. FIG. 6 shows entrance lenses 602, beam splitter 604, concave asphere 606 (i.e., magnifying mirror) and exit lenses 610. FIG. 6 is shown for illustrative purposes only and does not seek to limit the present invention to the illustrated configuration. The highly sophisticated catadioptric exposure optics 600 includes such components as may be necessary in, for example, step-and-scan type lithographic tools. An example of catadioptric exposure optics is described in commonly-owned U.S. Pat. No. 5,537,260 to Williamson, entitled "Catadioptric Optical Reduction System with High Numerical Aperture." The foregoing U.S. Patent is hereby incorporated by reference in its entirety.

Entrance lenses 602 are situated upon the entrance of catadioptric exposure optics 600. As an image enters catadioptric exposure optics 600, lenses 602 magnify and/or align the image. In addition, entrance lenses 602, or any other component situated upon the entrance of catadioptric exposure optics 600, can perform any task known to one of skill in the art.

Beam splitter 604 is a polarized mirror. Thus, light of the same polarity as beam splitter 604 can pass through it, while light of a different polarity is reflected by it. It should also be noted that beam splitter 604 is situated at a 45 degree angle from the incidence of the angle of an incoming image. Using FIG. 6 as an example, beam splitter 604 is situated at a 45 degree angle from the horizontal plane. This feature allows an incoming image to be reflected directly into concave asphere 606, due to Snell's Law (i.e., the angle of incidence is equal to the angle of reflection).

Concave asphere 606 increases the magnitude of an incoming image reflected by beam splitter 604. In addition, concave asphere 606 reverses the polarity of light carrying an incoming image reflected by beam splitter 604. Concave asphere 606 performs these tasks, as well as any other potential tasks, in a manner which is known to those skilled in the art of the present invention.

Exit lenses 610 are situated upon the exit of catadioptric exposure optics 600. As an image exits catadioptric exposure optics 600, lenses 610 magnify and/or align the image. In addition, exit lenses 610, or any other component situated upon the exit of catadioptric exposure optics 600, can perform any task known to one of skill in the art.

A. Image Path

Figure 7:
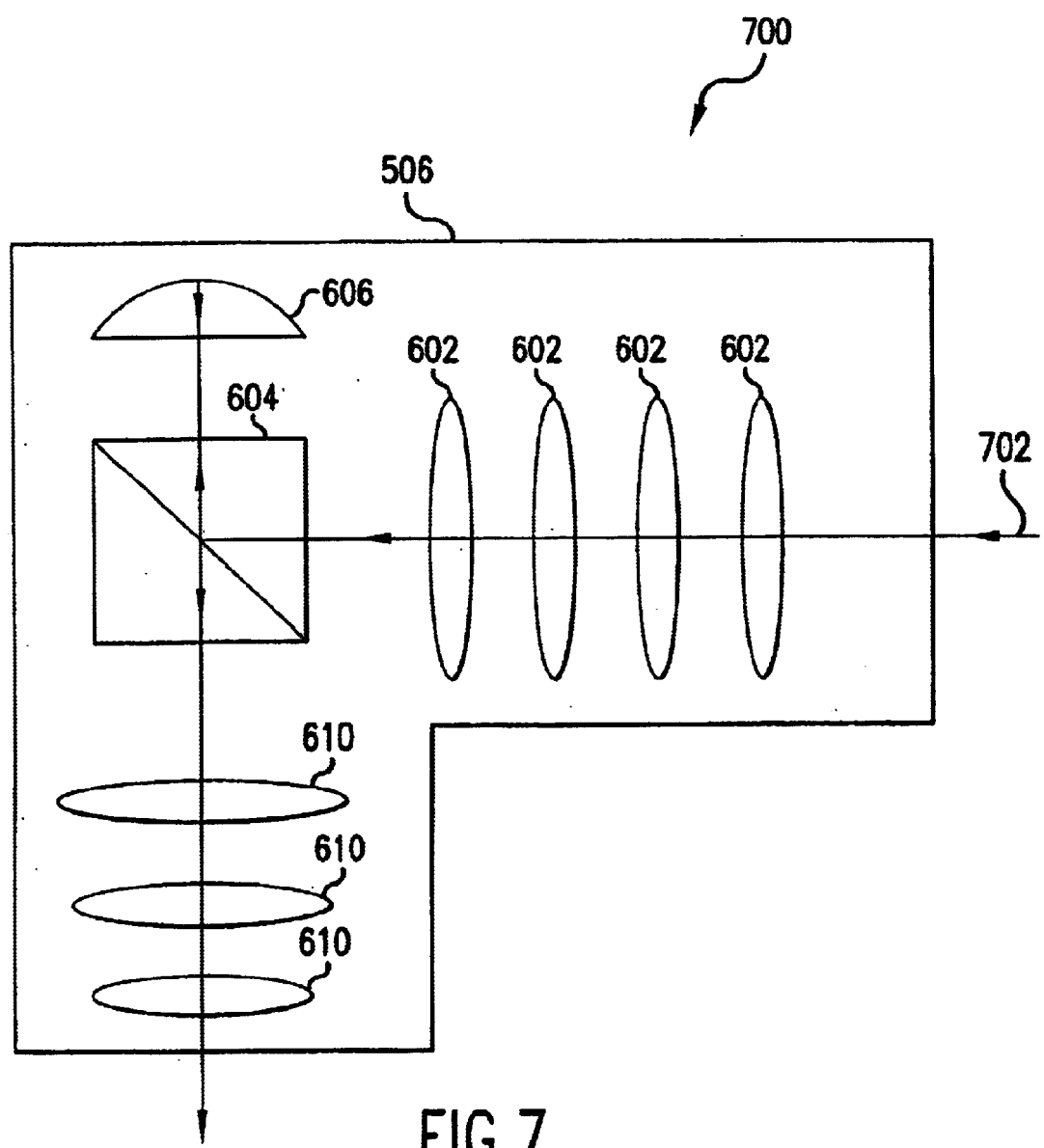
FIG. 7 is a diagram illustrating the image path in a lithographic system using orthogonal reticle and wafer stages, in an embodiment of the present invention.

FIG. 7 is a diagram illustrating the path taken by an image within example catadioptric exposure optics 700, in an embodiment of the present invention. In this embodiment, an image 702 enters catadioptric exposure optics 700 through a designated entrance. As image 702 enters catadioptric exposure optics 700, lenses 602 magnify and/or align image 702.

Subsequently, image 702 enters beam splitter 604. The light carrying image 702 through the entrance of catadioptric exposure optics 700 is of opposite polarity as beam splitter 604. Thus, image 702 is reflected by beam splitter 604. Due to the orientation of beam splitter 604 (i.e., its 45 degree angle), image 702 is reflected directly into concave asphere 606.

Next, image 702 is reflected off of concave asphere 606. Concave asphere 606 then increases the magnitude of image 702 and reverses the polarity of image 702. In addition, concave asphere 606, as known to one of skill in the art, flips the image around both axes. As a result, after being reflected by concave asphere 606, the light carrying image 702 is of the equal polarity as beam splitter 604.

Since the light carrying image 702 is now of equal polarity as beam splitter 604, image 702 passes through beam splitter 604. Then, image 702 is projected toward the exit of catadioptric exposure optics 700. In doing so, the image passes through exit lenses 610. As image 702 exits catadioptric exposure optics 700, lenses 610 magnify and/or align image 702. Subsequently, image 702 is projected onto wafer stage 504.

B. Projected Image

Figure 8:
FIG. 8 is a chart illustrating the orientation of an image during processing within the catadioptric exposure optics, in an embodiment of the present invention.

FIG. 8 is a chart 800 illustrating the orientation image 702 during processing within the catadioptric exposure optics, in an embodiment of the present invention. It should be noted that a rotation of the image of 180° is not a permanent problem, as this requires a simple rotation of the wafer 180° to correct. FIG. 8 shows how image 702 changes during processing by catadioptric exposure optics 700, as described in FIG. 7 above. The left column of chart 800 provides a description of the processing stage of image 702, as well as the viewing perspective. In other words, the left column describes where in the process image 702 is currently located, and how image 702 should be viewed.

The right column of chart 800 shows a representation of image 702 from the defined viewing perspective and at the defined processing stage.

The first row of chart 800 shows that image 702 is originally an image of the letter "F" if viewed from the perspective of a person standing behind catadioptric exposure optics 700 and looking into the entrance. The image of the second row of chart 800 is basically the image of the first row, rotated. The image of the second row is significant because it represents how the wafer will be viewed.

As explained above, it can be seen that, using the lithographic system and method of the present invention, an original image of the letter "F" will be projected as the image "ꟻ" onto wafer stage 504. It can be shown that the original image "F" is congruent to the projected image "ꟻ". This assertion becomes more clear when the projected image "ꟻ" is rotated one hundred and eighty (180) degrees clockwise. After the rotation, the projected image "ꟻ" becomes identical to the original image "F." In contrast, an image that has undergone one image flip is not congruent to the original image. This is because there are no number of rotations of the flipped image that will render the flipped image identical to the original image.

Figure 1:
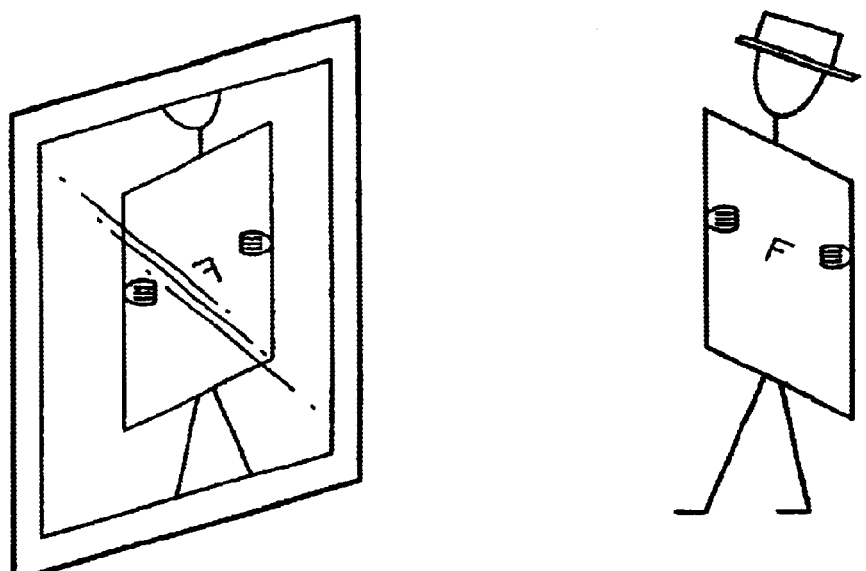
FIG. 1 is a picture illustrating the image flip problem, in an embodiment of the present invention.
Figure 2:
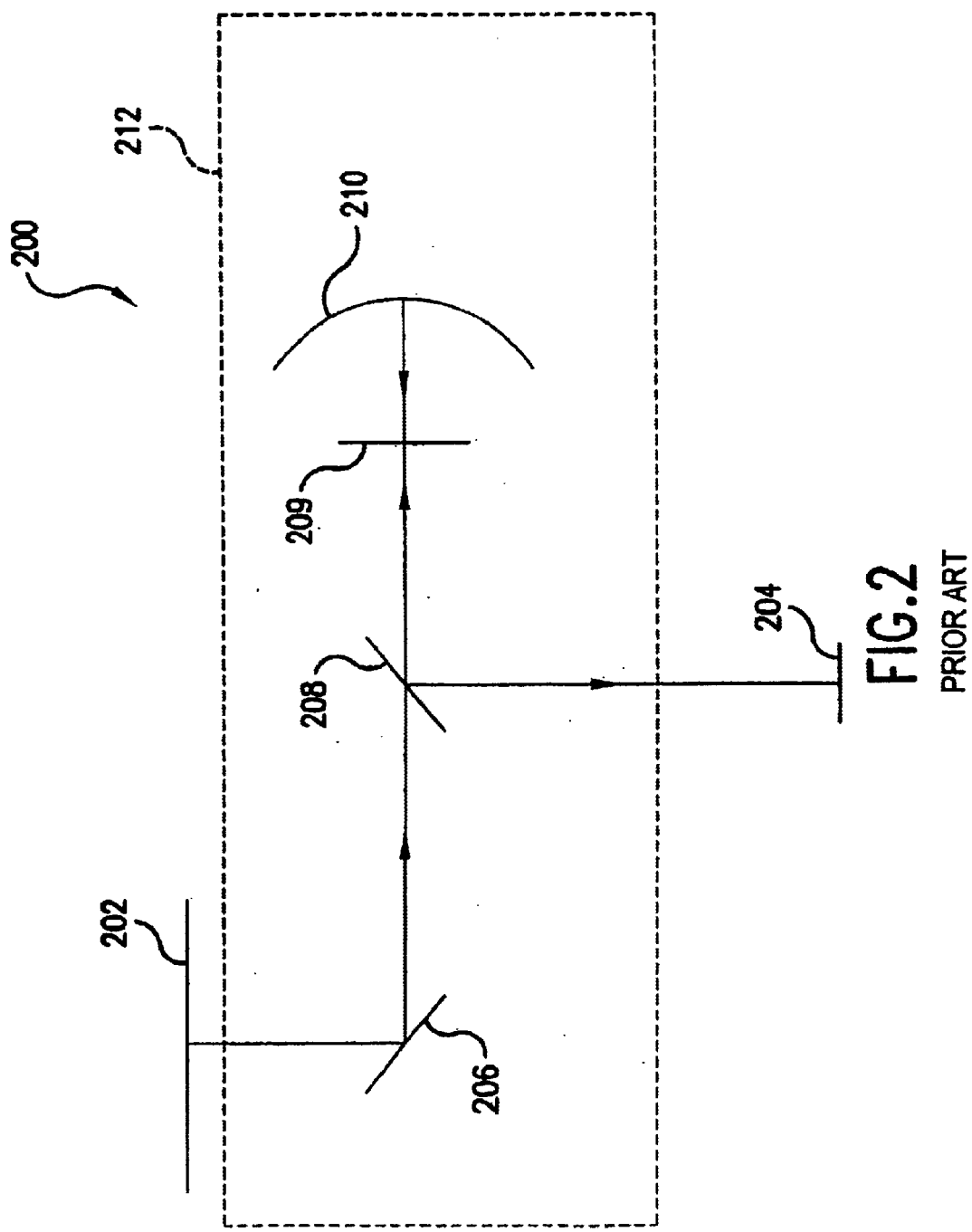
FIG. 2 is a diagram illustrating a typical lithographic system using catadioptric exposure optics, parallel reticle and wafer stages and a magnifying mirror.
Figure 3:
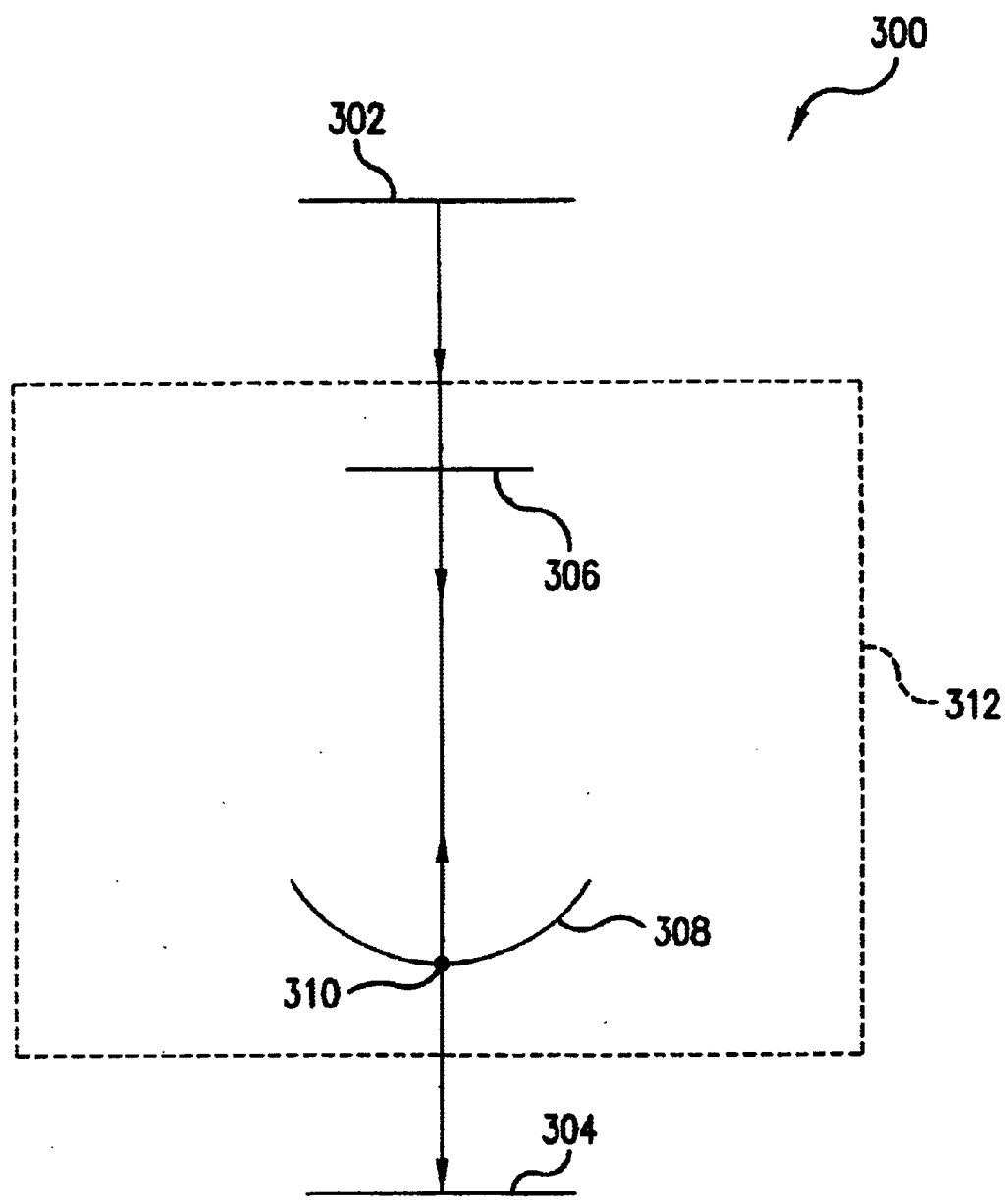
FIG. 3 is a diagram illustrating a lithographic system using the centrally obscured optical system design.
Figure 4:
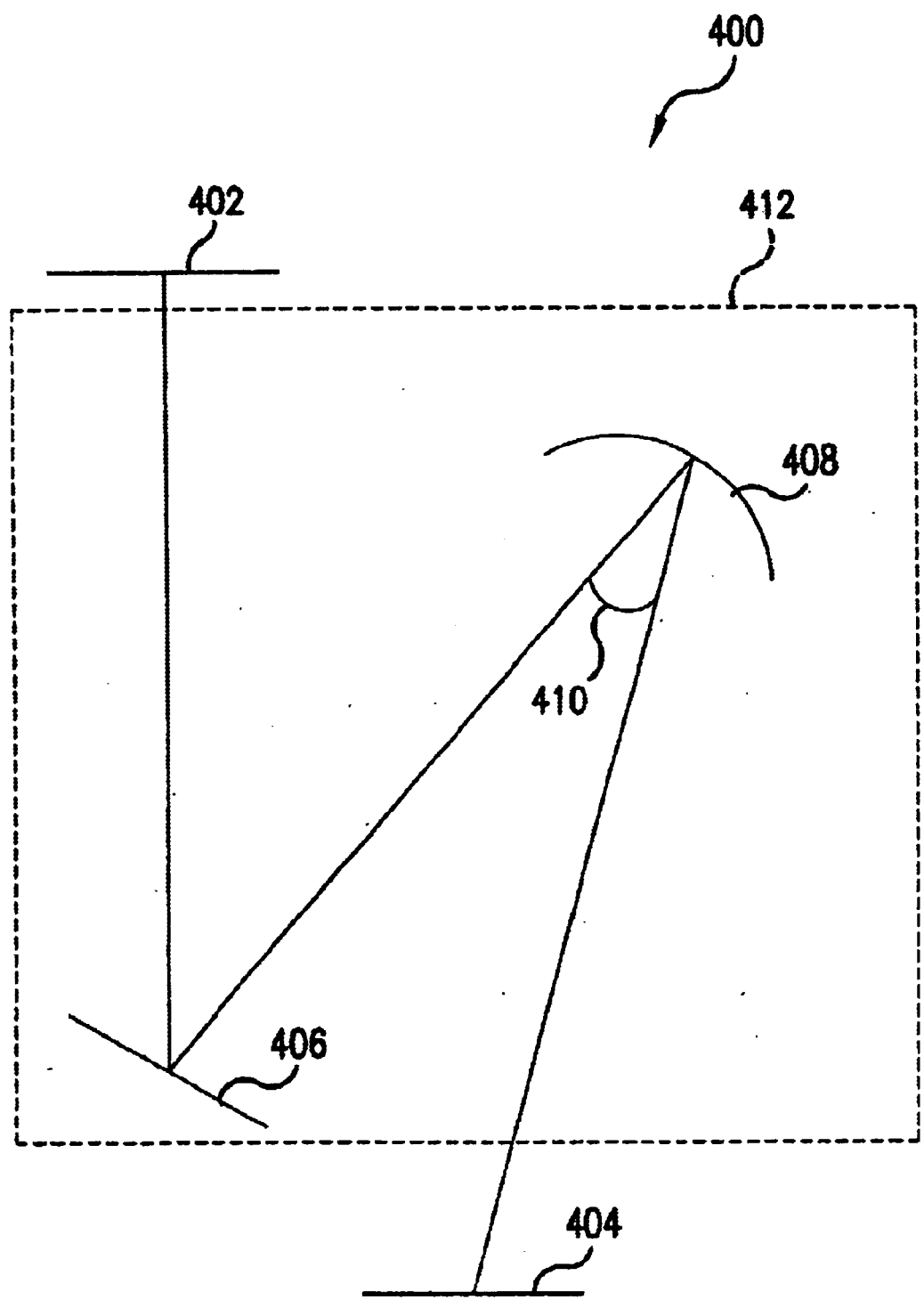
FIG. 4 is a diagram illustrating a lithographic system using the off-axis design.

Further, the lithographic system of the present invention does not posses the problems associated with alternative lithographic system designs (as described above), such as the centrally obscured optical system design (see FIG. 3) and the off-axis design (see FIG. 4). One reason for this is because the lithographic system of the present invention does not utilize a configuration using a magnifying mirror with a small hole, through which the image passes. Thus, the lithographic system of the present invention does not exhibit obscured areas.

Another reason why the lithographic system of the present invention does not posses the problems associated with alternative lithographic system designs is because of the use of the magnifying mirror. The lithographic system of the present invention projects images directly (i.e, perpendicularly) into the magnifying mirror (i.e., the concave asphere). In addition, the lithographic system of the present invention projects images directly out of the magnifying mirror and directly onto another surface, such as the wafer stage. Thus, the lithographic system of the present invention does not exhibit perspective warping and related problems.

IV. Dual Wafer Stage

In an embodiment of the present invention, a dual wafer stage is used to make the manufacturing process more efficient. A dual wafer stage includes the use of two, separate wafer stages operating in tandem, such that one wafer may be exposed while the other is loading. This embodiment of the present invention increases lithography tool throughput while simultaneously increasing the volume of alignment data collected through the use of two substrate stages. Each substrate stage has associated load/unload and data collection stations. The load/unload and data collection stations are located on either side of an exposure station. The substrate stages are mounted on a common rail such that as a first stage moves away from the exposure station, a second stage can immediately move in to take its place under the exposure apparatus. Through this arrangement, use of the exposure apparatus is maximized. Because wafer data collection and exposure steps occur in parallel in the instant invention, the compromised wafer alignment strategies sometimes employed to increase throughput need not be used. In fact, the parallel nature of the instant invention allows for greater data collection without a corresponding decrease in throughput.

In another embodiment of the present invention, the lithography apparatus comprises an exposure station and a plurality of substrate stages, each of the substrate stages having an associated data collection station separate from a data collection station associated with other of the plurality of substrate stages. Each of the plurality of substrate stages is movable from the associated data collection station to the exposure station.

During operation, each of the plurality of substrate stages is alternately moved from its associated data collection station to the exposure station such that data collection of a first of the plurality of substrate stages can occur at the same time a second of the plurality of substrate stages is undergoing exposure at the exposure station.

The lithography apparatus can further be characterized as including first and second data collection cameras disposed over first and third positions within the apparatus. The exposure apparatus being disposed over a second position within the lithography apparatus. The first and second substrate stages being movable from the first position to said second position and from the third position to the second position, respectively.

Figure 9:
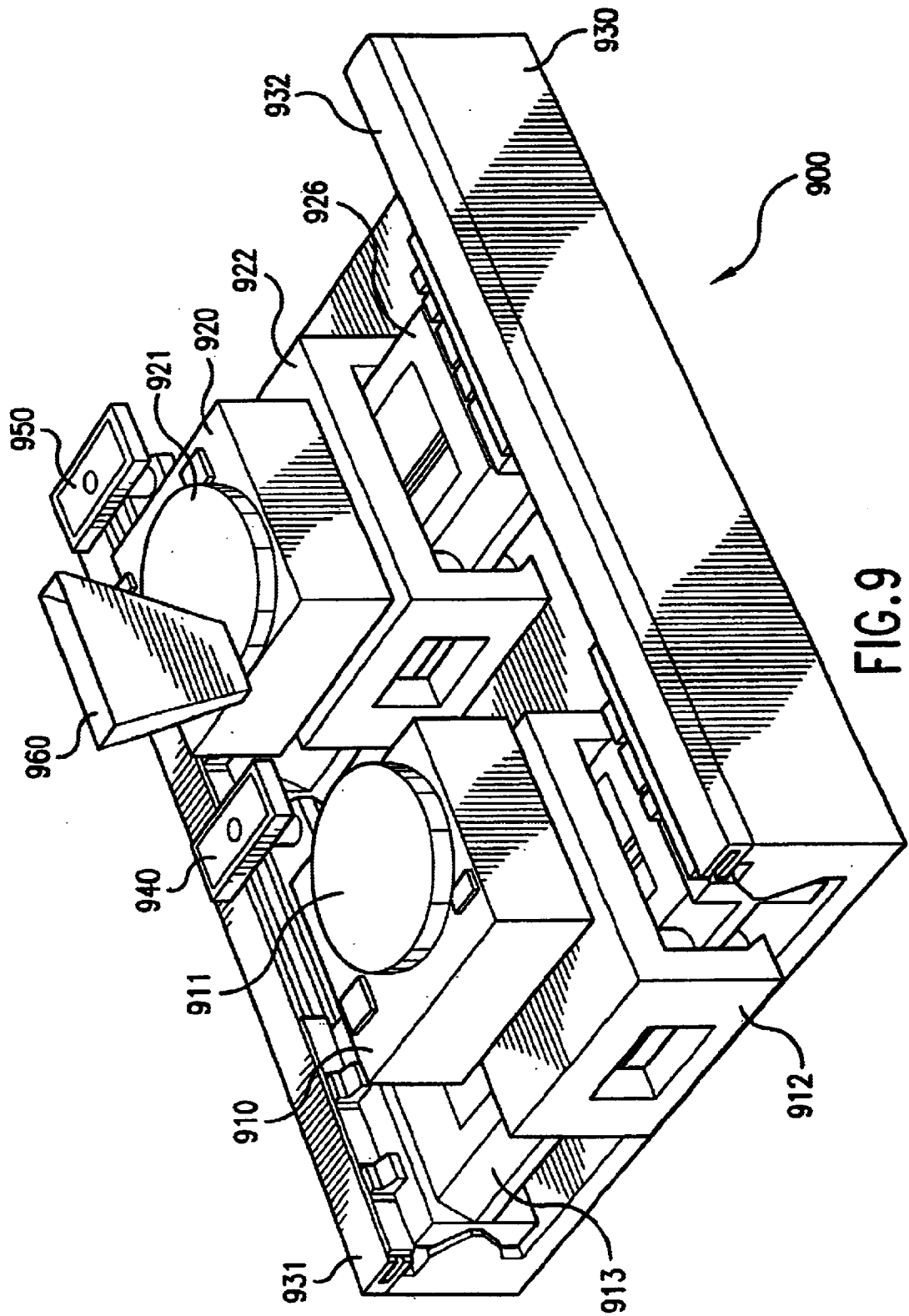
FIG. 9 is an illustration of a dual wafer stage, in an embodiment of the present invention.

FIG. 9 illustrates a dual wafer stage, in an embodiment of the present invention. Data collection and exposure structure 900 includes a first wafer stage 910 and a second wafer stage 920. The first and second wafer stages are depicted in the figures as having wafers 911 and 921 mounted thereon. Wafer stage 910 is mounted via sub-stages 912 and 913 to rail 930. Sub-stage 913 is movably mounted to sub-stage 912 to permit stage movement in a direction perpendicular to rail 930. Though not shown, substages 912 and 913 can include components of a linear brushless motor of the type known to those skilled in the art to effectuate this movement. Motors 931 and 932 propel sub-stage 913 along the rail 930. Motors 931 and 932 can also be linear brushless motors of the type known to those skilled in the art. Likewise, wafer stage 920 is mounted to rail 930 via sub-stages 922 and 926. Motors 931 and 932 also propel sub-stage 926 along rail 930. As with sub-stages 912 and 913, an additional motor components are included within sub-stages 922 and 926 to effectuate stage movement in a direction perpendicular to rail 930. Furthermore, interferometers (not shown) are disposed within the structure to accurately determine the location of wafer stages 910 and 920 on rail 930 and along an axis perpendicular to 930. These interferometers work together with a control system to control stage movement.

Data collection and exposure structure 900 works together with first and second data collection cameras 940 and 950, respectively. These cameras are mounted to a structure separate from the data collection and exposure apparatus. These data collection cameras are of the type known to those skilled in the art as being capable of data gathering for calibration functions such as wafer alignment target mapping and wafer flatness mapping. The first and second data collection cameras are mounted above regions referred to herein respectively as first and second data collection stations. The term data collection station is meant to refer to a region along rail 930 where wafer data collection occurs during operation and is not meant to be limited to a single particular wafer stage location within the structure. The data collection station associated with each data collection camera is larger in area than its associated wafer stage since each wafer stage moves within its associated data collection station during the data collection process. Data collection cameras 940 and 950 communicate with a control system.

Data collection and exposure structure 900 further works together with exposure apparatus 960. While exposure optics are used in the case of photolithography, a different type of exposure apparatus may be used depending on the particular application. For example, x-ray, ion, electron, or photon lithographies each may require a different exposure apparatus, as is known to those skilled in the art. The particular example of photolithography is discussed here for illustrative purposes only. Exposure optics 960 are mounted to the same structure, separate from the data collection and exposure apparatus, to which data collection cameras 940 and 950 are mounted, as discussed above. Exposure optics are of the type known to those skilled in the art as being capable of lithographic exposure functions. These exposure optics can include, for example, components and functionality for use in step-and-scan type tools as well as step and repeat tools where the full reticle field is exposed without scanning. Exposure optics 960 is disposed above a region referred to herein as the exposure station. The term exposure station is meant to refer to a region along rail 930 where wafer exposure occurs during operation and is not meant to be limited to a single particular wafer stage location within the structure. The exposure station is larger in area than a single one of the wafer stages since the wafer stage being exposed moves within the exposure station during the wafer exposure process. The exposure station is located between the first and second data collection stations.

The concept of a dual wafer stage is explained in more detail in commonly-owned U.S. patent application Ser. No. 09/449,630, now abandoned to Roux et al, entitled "Dual Stage Lithography Apparatus and Method," filed Nov. 30, 1999. The foregoing U.S. Patent Application is hereby incorporated by reference in its entirety.

Referring to FIG. 5, a dual wafer stage, as described above, can be interchanged with wafer stage 504. The combination of a dual wafer stage with lithographic system 500 yields a lithographic system capable of high throughput while using catadioptric exposure optics that produce a high quality image without image flip.

V. Dual Isolation System

In an embodiment of the present invention, a dual isolation system is used to make the manufacturing process more precise. A dual isolation system includes the isolation of the wafer stage and the reticle stage, such that both stages are protected from environmental motion. In one aspect, an isolated base frame is supported by a non-isolated tool structure. A wafer stage component is supported by the isolated base frame. The wafer stage component provides a mount for attachment of a semiconductor wafer. A reticle stage component is supported by the isolated base frame. The reticle stage component provides a mount for a reticle. An isolated bridge provides a mount for a projection optics. The isolated bridge is supported by the isolated base frame. Radiation from an illumination source passes through a reticle mounted at the provided reticle mount to a surface of an attached semiconductor wafer. A pattern of a mounted reticle is transferred to a surface of an attached semiconductor wafer.

In another aspect, an isolated bridge provides a mount for a projection optics. The isolated bridge is supported by a non-isolated base frame. A wafer stage component is supported by the non-isolated base frame. The wafer stage component provides a mount for attachment of a semiconductor wafer. A reticle stage component is supported by the non-isolated base frame. The reticle stage component provides a mount for a reticle. An isolated optical relay is supported by the non-isolated base frame. The isolated optical relay includes at least one servo controlled framing blade. The one or more servo controlled framing blades are configured such that radiation from an illumination source would be framed and imaged onto a reticle mounted at the provided reticle mount. The radiation would pass through the reticle plane to a surface of an attached semiconductor wafer. A pattern of a mounted reticle would be transferred to an attached semiconductor wafer surface.

Figure 10:
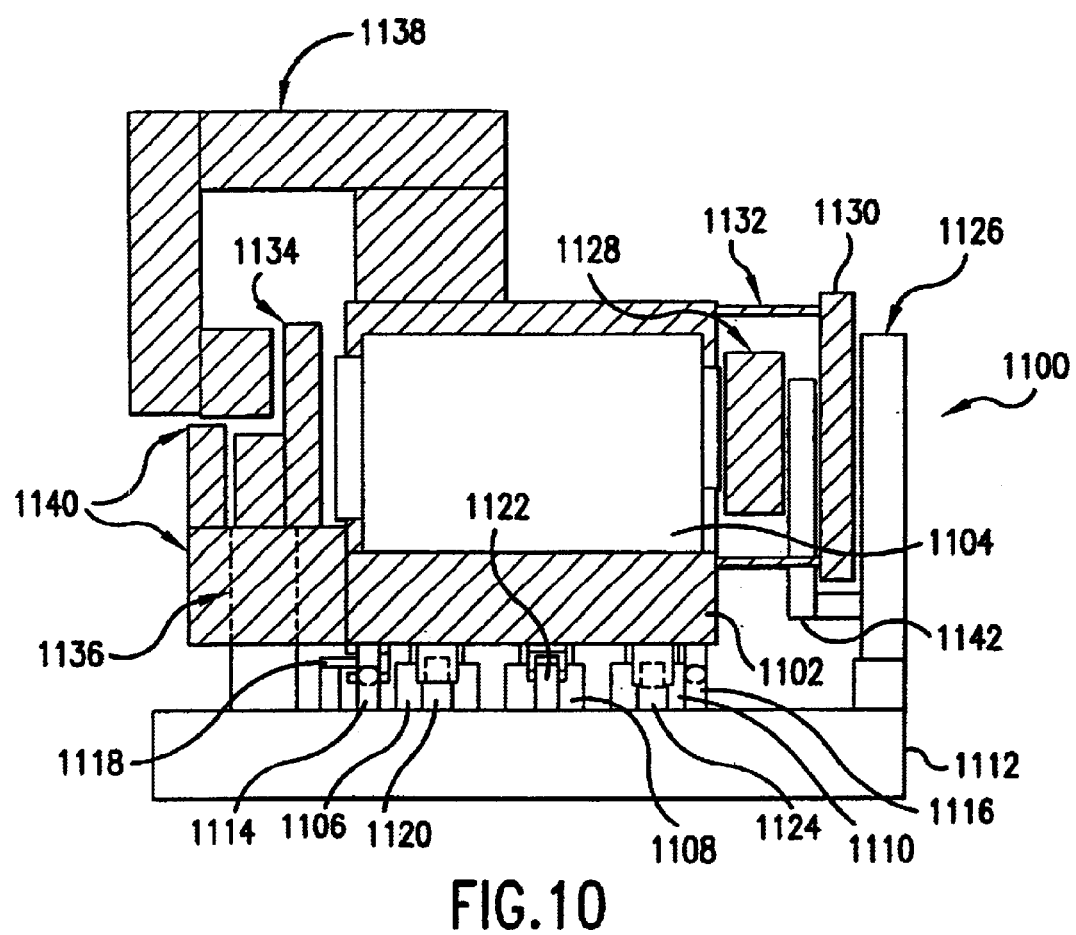
FIG. 10 is an illustration of a dual isolation system, in an embodiment of the present invention.

FIG. 10 illustrates a dual isolation system, in an embodiment of the present invention. Lithographic tool apparatus 1100 incorporates an isolation system to minimize motion in the structure supporting critical optical components. Lithographic tool apparatus 1100 includes an isolated bridge 1102, a projection optics 1104, a first, second, and third pneumatic isolator 1106, 1108, and 1110, a non-isolated base frame 1112, a first and second relative position sensor 1114 and 1116, a first, second, third, and fourth actuator 1118, 1120, 1122, and 1124, a wafer sub-stage 1126, a wafer precision stage 1128 with a bracket 1142, a focus back plate 1130, one or more flexured spacing rods 1132, a reticle stage 1134, a linear motor 1136, a 1× relay 1138, and air bars 1140. These elements of lithographic tool apparatus 1100 are more fully described in the following text and subsections below.

The concept of a dual isolation system is explained in more detail in commonly-owned U.S. Pat. No. 6,538,720, to Galburt et al, entitled "Lithographic Tool with Dual Isolation System and Method for Configuring the Same," issued Mar. 25, 2003. The foregoing U.S. Patent Application is hereby incorporated by reference in its entirety.

Referring to FIG. 5, a dual isolation system, as described above, can be integrated with wafer stage 504. The combination of a dual isolation system with lithographic system 500 yields a lithographic system capable of increased operational precision while using catadioptric exposure optics that produce a high quality image without image flip.

VI. Conclusion

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A lithography apparatus, comprising:
   a reticle stage that one of transmits or reflects an image;
   an exposure station;
   a plurality of wafer stages, each of said wafer stages having an associated data collection station separate from a data collection station associated with other of said plurality of wafer stages, wherein said reticle stage is oriented substantially orthogonal to each of said plurality of wafer stases; and
   a catadioptric exposure optics element, oriented between said reticle stage and one of said plurality of wafer stages, that causes an even number of reflections of said image and that projects said image onto said one of said plurality of wafer stages in a congruent manner.

2. The lithography apparatus of claim 1, wherein said projected image substantially lacks aberrations, including any one of:
   perspective warping; and
   obscured areas.

3. The lithography apparatus of claim 1, wherein each of said plurality of wafer stages is movable from said associated data collection station to said exposure station.

4. The lithography apparatus of claim 1, wherein during operation each of said plurality of wafer stages is alternately moved from said associated data collection station to said exposure station such that data collection of a first of said plurality of wafer stages can occur at the same time a second of said plurality of wafer stages is undergoing exposure at said exposure station.

5. The lithography apparatus of claim 1, further comprising:
   a first data collection camera disposed over a first position within the apparatus;
   an exposure apparatus disposed over a second position within the apparatus; and
   a second data collection camera disposed over a third position within the apparatus,
   wherein said plurality of wafer stases includes
      a first wafer stage movable from said first position to said second position; and
      a second wafer stage movable from said third position to said second position.

6. The lithography apparatus of claim 5, further comprising a rail, said first and said second wafer stages movably mounted to said rail.

7. A lithography apparatus comprising:
   a reticle stage that one of transmits or reflects an image;
   a wafer stage, said reticle stage oriented substantially orthogonal to said wafer stage;
   a catadioptric exposure optics element, oriented between said reticle stage and said wafer stage, that causes an even number of reflections of said image and that projects said image onto said wafer stage in a congruent manner; and
   a dual isolation system comprising
      an isolated base frame supported by a non-isolated tool structure;
      a wafer stage component to provide a mount for attachment of a semiconductor wafer, supported by said isolated base frame;
      a reticle stage component to provide a mount for a reticle, supported by said isolated base frame; and
      an isolated bridge to provide a mount for said catadioptric exposure optics element, supported by said isolated base frame.

8. A lithography method, comprising the steps of:
   providing a reticle stage for transmitting or reflecting an image;
   providing an exposure station;
   providing a plurality of wafer stages for receiving the image, each of said wafer stages having an associated data collection station separate from a data collection station associated with other of said plurality of wafer stages;
   orienting said reticle state substantially orthogonal to each of said plurality of wafer stages; and
   orienting a catadioptric exposure optics element between said reticle stage and said wafer stage to cause an even number of reflections of said image and to project said image onto said wafer stage in a congruent manner.

9. The lithography method of claim 8, further comprising the step of projecting an image substantially lacking in aberrations, including any one of:
   perspective warping; and
   obscured areas.

10. The lithography method of claim 8, further comprising the step of allowing each of said plurality of wafer stages to be movable from said associated data collection station to said exposure station.

11. The lithography method of claim 8, further comprising the step of alternately moving each of said plurality of wafer stages during operation from said associated data collection station to said exposure station such that data collection of a first of said plurality of wafer stages can occur at the same time a second of said plurality of wafer stages is undergoing exposure at said exposure station.

12. The lithography method of claim 8, further comprising the steps of:
　providing a first data collection camera disposed over a first position;
　providing an exposure apparatus disposed over a second position; and
　providing a second data collection camera disposed over a third position,
　wherein said step of providing a plurality of wafer stases includes
　　providing a first wafer stage movable from said first position to said second position; and
　　providing a second wafer stage movable form said third position to said second position.

13. The lithography method of claim 12, further comprising the step of providing a rail, said first and said second wafer stages movably mounted to said rail.

14. A lithography method comprising the steps of:
　providing a reticle stage for transmitting or reflecting an image;
　providing a wafer stage for receiving the image;
　orienting said reticle stage substantially orthogonal to said wafer stage;
　orienting a catadioptric exposure optics element between said reticle stage and said wager stage to cause an even number of reflections of said image and to project said image onto said wafer stage in congruent manner;
　providing an isolated base frame supported by a non-isolated tool structure;
　providing a wafer stage component to provide a mount for attachment of a semiconductor wafer, supported by said isolated base frame;
　providing a reticle stage component to provide a mount for a reticle, supported by said isolated base frame; and
　providing an isolated bridge to provide a mount for said catadioptric exposure optics element, supported by said isolated base frame,
　wherein a dual isolation method is provided.

\* \* \* \* \*

UNITED STATES PATENT AND TRADEMARK OFFICE
CERTIFICATE OF CORRECTION

PATENT NO. : 6,757,110 B2
DATED : June 29, 2004
INVENTOR(S) : Sewell et al.

It is certified that error appears in the above-identified patent and that said Letters Patent is hereby corrected as shown below:

Column 2,
Line 8, the second "F" should have been printed as -- ꟻ --.

Column 8,
Lines 16, 17, 19, and 20, each "ꓶ" should have been printed as -- ꓩ --.
Lines 27 and 37, "posses" should have been printed as -- possess --.

Column 9,
Line 41, the "an" before "additional" should have been deleted.

Column 11,
Line 56, "stases" should have been printed as -- stages --.

Column 12,
Line 19, "stases" should have been printed as -- stages --.
Line 56, "state" should have been printed as -- stage --.

Column 13,
Line 20, "stases" should have been printed as -- stages --.
Line 24, "form" should have been printed as -- from --.

Column 14,
Line 11, "wager" should have been printed as -- wafer --.
Line 13, "in congruent" should have been printed as -- in a congruent --.

Signed and Sealed this

Fifteenth Day of February, 2005

JON W. DUDAS
*Director of the United States Patent and Trademark Office*